(12) United States Patent
Takeuchi

(10) Patent No.: US 10,720,899 B2
(45) Date of Patent: *Jul. 21, 2020

(54) RADIO-FREQUENCY MODULE

(71) Applicant: Murata Manufacturing Co., Ltd., Nagaokakyo-shi, Kyoto-fu (JP)

(72) Inventor: Morio Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/438,594

(22) Filed: Jun. 12, 2019

(65) Prior Publication Data

US 2019/0296708 A1 Sep. 26, 2019

Related U.S. Application Data

(63) Continuation of application No. 15/860,694, filed on Jan. 3, 2018, now Pat. No. 10,396,749, which is a
(Continued)

(30) Foreign Application Priority Data

Jul. 6, 2015 (JP) .................................. 2015-135589

(51) Int. Cl.
*H04B 1/00* (2006.01)
*H03H 7/38* (2006.01)
(Continued)

(52) U.S. Cl.
CPC .............. *H03H 7/38* (2013.01); *H03H 7/465* (2013.01); *H03H 9/70* (2013.01); *H04B 1/00* (2013.01);
(Continued)

(58) Field of Classification Search
CPC ............ H03H 7/38; H03H 7/465; H03H 9/70; H03H 7/20; H03H 9/0004; H04B 1/00;
(Continued)

(56) References Cited

U.S. PATENT DOCUMENTS 7,738,850 B2 * 6/2010 Byun ...................... H04B 1/18
333/129
8,120,443 B2 * 2/2012 Ziaei ....................... H01P 1/38
333/105
(Continued)

OTHER PUBLICATIONS

Takeuchi, "Radio-Frequency Module", U.S. Appl. No. 15/860,694, filed Jan. 3, 2018.

*Primary Examiner* — Sonny Trinh
(74) *Attorney, Agent, or Firm* — Keating & Bennett, LLP

(57) ABSTRACT

A radio-frequency module utilizing carrier aggregation includes a switch circuit that includes one input terminal and three or more output terminals and that simultaneously connects the input terminal and each of two or more output terminals selected from the output terminals, signal paths that propagate signals of corresponding frequency bands, band pass filters in the signal paths, and variable matching circuits in the signal paths. The circuit states of the variable matching circuits are changed in accordance with a combination of two or more signal paths simultaneously connected to the input terminal.

10 Claims, 6 Drawing Sheets

Related U.S. Application Data continuation of application No. PCT/JP2016/069673, filed on Jul. 1, 2016.

(51) Int. Cl.
*H04B 1/40* (2015.01)
*H04B 1/18* (2006.01)
*H04B 1/50* (2006.01)
*H03H 7/46* (2006.01)
*H03H 9/70* (2006.01)
*H03H 7/20* (2006.01)
*H03H 9/00* (2006.01)

(52) U.S. Cl.
CPC ........... *H04B 1/006* (2013.01); *H04B 1/0053* (2013.01); *H04B 1/18* (2013.01); *H04B 1/40* (2013.01); *H04B 1/50* (2013.01); *H03H 7/20* (2013.01); *H03H 9/0004* (2013.01)

(58) Field of Classification Search
CPC ........ H04B 1/0053; H04B 1/006; H04B 1/40; H04B 1/18; H04B 1/50
See application file for complete search history.

(56) References Cited

U.S. PATENT DOCUMENTS

2008/0119214 A1* 5/2008 Liu .................... H03H 7/38
　　　　　　　　　　　　　　　　　　　　455/522
2014/0321312 A1* 10/2014 Narahashi ............. H04B 1/525
　　　　　　　　　　　　　　　　　　　　370/252

* cited by examiner

RADIO-FREQUENCY MODULE

CROSS REFERENCE TO RELATED APPLICATIONS

This application claims the benefit of priority to Japanese Patent Application No. 2015-135589 filed on Jul. 6, 2015 and is a Continuation Application of PCT Application No. PCT/JP2016/069673 filed on Jul. 1, 2016. The entire contents of each application are hereby incorporated herein by reference.

BACKGROUND OF THE INVENTION

1. Field of the Invention

The present invention relates to a radio-frequency module that processes radio-frequency signals.

2. Description of the Related Art

The latest cellular phones are required to handle multiple frequencies and multiple wireless systems with a single terminal (multiband- and multimode-support cellular phones). Multiband- and multimode-support front-end modules are required to process multiple sent signals or multiple received signals at high speed without loss of quality.

Japanese Unexamined Patent Application Publication No. 2015-2395 discloses a radio-frequency module including two sending-and-receiving circuits each including a switch IC connected to an antenna, a matching circuit, a filter, and a separator.

Japanese Unexamined Patent Application Publication No. 2014-36409 discloses a radio-frequency circuit including switches connected to antennas, matching circuits, filters, and duplexers.

Carrier aggregation (CA) for performing communication by simultaneously using multiple frequency bands is applied to the communication standard LTE (Long Term Evolution)-Advanced. To perform CA communication, the radio-frequency module disclosed in Japanese Unexamined Patent Application Publication No. 2015-2395 uses two antennas so that it is able to simultaneously send or receive signals of multiple different frequency bands.

However, in response to a demand for reducing the size of cellular phones, it is desirable to perform CA communication by using a single antenna.

It is possible to perform CA communication in the radio-frequency circuit disclosed in Japanese Unexamined Patent Application Publication No. 2014-36409 by using a specific combination of multiple frequency bands. However, if CA communication is performed by selecting any combination of multiple frequency bands, the following problem occurs. If a matching circuit dedicated to a specific combination of multiple frequency bands is used, the bandpass characteristics of each filter are significantly decreased for another combination of multiple frequency bands due to impedance mismatching, for example. Every time the combination of frequency bands operating in the CA mode is switched, the bandpass characteristics of each filter fluctuate, thus failing to maintain the communication quality.

SUMMARY OF THE INVENTION

Preferred embodiments of the present invention provide small radio-frequency modules that are able to maintain high transmission performance for radio-frequency signals in response to a change in the combination of frequency bands operating in the carrier aggregation mode.

A radio-frequency module according to a preferred embodiment of the present invention utilizes carrier aggregation in which communication is performed by simultaneously using at least two frequency bands selected from a plurality of frequency bands having different frequencies. The radio-frequency module includes a switch circuit that includes one input terminal and three or more output terminals and that simultaneously connects the input terminal and each of two or more output terminals selected from the three or more output terminals; a plurality of signal paths that propagate signals of corresponding frequency bands of the plurality of frequency bands and that are connected to the three or more output terminals based on a one-to-one correspondence; a filter element provided in each of the plurality of signal paths; and a variable matching circuit provided in at least one of the plurality of signal paths. A circuit state of the variable matching circuit is changed in accordance with a combination of two or more signal paths simultaneously connected to the input terminal among the plurality of signal paths.

With this configuration, high transmission performance for sent signals or received signals propagating through simultaneously connected signal paths is able to be maintained in response to a change in the combination of frequency bands operating in the carrier aggregation mode. Additionally, the switch circuit is capable of simultaneously connecting two or more signal paths by using only one input terminal, thus making it possible to provide a small radio-frequency module.

The switch circuit may output a control signal indicating a connection relationship between the input terminal and the three or more output terminals. The circuit state of the variable matching circuit may be changed based on the control signal.

The variable matching circuit disposed in a signal path obtains a control signal to change the circuit state of the variable matching circuit from the switch circuit connected to this signal path, so that the transmission path for the control signal is able to be short. It is thus possible to reduce the size of the radio-frequency module.

A radio-frequency module according to a preferred embodiment of the present invention may further include an amplifier circuit that is connected to the filter elements within the plurality of signal paths and that amplifies signals of the corresponding frequency bands. The amplifier circuit may output a control signal indicating information concerning signal paths used for simultaneous communication selected from the plurality of signal paths. The circuit state of the variable matching circuit may be changed based on the control signal.

The variable matching circuit disposed in a signal path obtains a control signal to change the circuit state of the variable matching circuit from the amplifier circuit connected to this signal path, so that the transmission path for the control signal is able to be short. It is thus possible to reduce the size of the radio-frequency module.

One of the plurality of signal paths may branch to a received-signal path to propagate a signal received via the switch circuit and to a sending-signal path to propagate a sent signal to the switch circuit. The filter element disposed at a branch point between the received-signal path and the sending-signal path may be a duplexer.

The frequency bandwidth in a signal path that simultaneously propagates both of a sent signal and a received signal is wider than that in a signal path that propagates only a sent signal or a received signal. For this reason, it is more difficult to provide impedance matching for a duplexer disposed in a sending-and-receiving signal path. A greater degree of impedance mismatching may occur in a duplexer when the combination of frequency bands operating in the CA mode is changed.

It is possible to effectively provide impedance matching for duplexers disposed in signal paths operating in the CA mode by using the variable matching circuit described above.

The variable matching circuit may include a variable phase circuit that changes, in accordance with a combination of two or more signal paths simultaneously connected to the input terminal among the plurality of signal paths, a phase of each of signals propagating through the two or more signal paths.

With this configuration, in response to a change in the combination of signal paths operating in the CA mode, it is possible to vary the phase of sent signals or received signals propagating through the simultaneously connected signal paths. In this case, concerning the filter element disposed in one of the selected signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

The variable matching circuit may include a variable LC resonance circuit in which a LC resonant frequency is changed in accordance with a combination of two or more signal paths simultaneously connected to the input terminal among the plurality of signal paths.

It is thus possible to vary the LC resonant frequency of the LC resonance circuit in response to a change in the combination of signal paths operating in the CA mode. In this case, concerning the filter element disposed in one of the selected signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

The variable matching circuit may include a variable elastic wave resonance circuit in which an anti-resonant frequency is changed in accordance with a combination of two or more signal paths simultaneously connected to the input terminal among the plurality of signal paths.

It is thus possible to vary the anti-resonant frequency of an elastic wave resonator in response to a change in the combination of signal paths operating in the CA mode. In this case, concerning the filter element disposed in one of the selected signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

A radio-frequency module according to a preferred embodiment of the present invention may include a first variable matching circuit and a second variable matching circuit connected in series with each other in one of the plurality of signal paths.

With this configuration, more stages of variable matching circuits are provided, and also, multiple different variable matching circuits, such as a variable phase circuit and a LC resonance circuit connected in series with each other, may be provided, thus improving the degree of matching between simultaneously connected signal paths.

A radio-frequency module according to a preferred embodiment of the present invention may include a first variable matching circuit and a second variable matching circuit connected in parallel with each other in one of the plurality of signal paths.

This makes it possible to reduce a signal transmission loss at a variable matching circuit in a signal path in which it is desired to reduce a signal transmission loss when providing matching between this signal path and another signal path, for example.

The plurality of frequency bands may include, for example, Band1 having a transmit band of 1920 MHz to 1980 MHz and a receive band of 2110 MHz to 2170 MHz in a LTE (Long Term Evolution) standard, Band3 having a transmit band of 1710 MHz to 1785 MHz and a receive band of 1805 MHz to 1880 MHz in the LTE standard, and Band7 having a transmit band of 2500 MHz to 2570 MHz and a receive band of 2620 MHz to 2690 MHz in the LTE standard. The radio-frequency module may perform simultaneous communication by selecting one of a combination of the Band1 and the Band3, a combination of the Band3 and the Band7, and a combination of the Band7 and the Band1.

In the system in which a CA operation is performed by using Band1, Band3, and Band7 of the LTE standard, high transmission performance for sent signals or received signals is able to always be maintained by selecting any of a combination of Band1 and Band3, a combination of Band3 and Band7, and a combination of Band7 and Band1.

A radio-frequency module according to a preferred embodiment of the present invention may further include an antenna element connected to the input terminal.

As an antenna element connected to the input terminal of the switch circuit, only one antenna element is sufficient, thus reducing the size of a radio-frequency module including this antenna element.

According to preferred embodiments of the present invention, it is possible to provide small radio-frequency modules that are able to maintain high transmission performance for radio-frequency signals in response to a change in the combination of frequency bands operating in the carrier aggregation mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
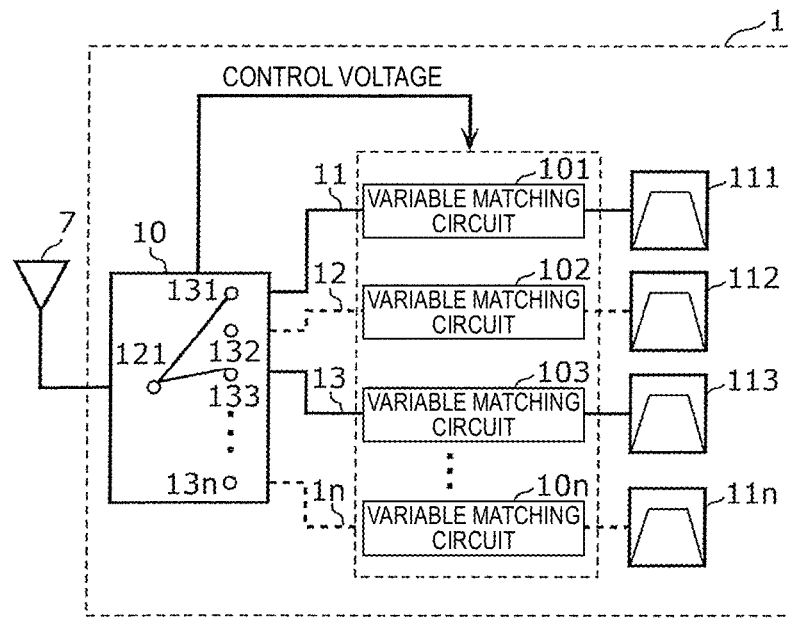
FIG. 1A is a circuit diagram illustrating a CA operation of a radio-frequency module according to a first preferred embodiment of the present invention.

Preferred embodiments of the present invention will be described below in detail with reference to the drawings. All of the preferred embodiments described below illustrate general or specific examples. Numeric values, configurations, materials, components, and positions and connection states of the components illustrated in the following preferred embodiments are only examples, and are not described to limit the present invention. Among the components illustrated in the following preferred embodiments, the components that are not recited in the independent claims will be described as optional components. The sizes and dimensional ratios of the components in the drawings are not necessarily illustrated as actual sizes and ratios.

First Preferred Embodiment

Figure 1B:
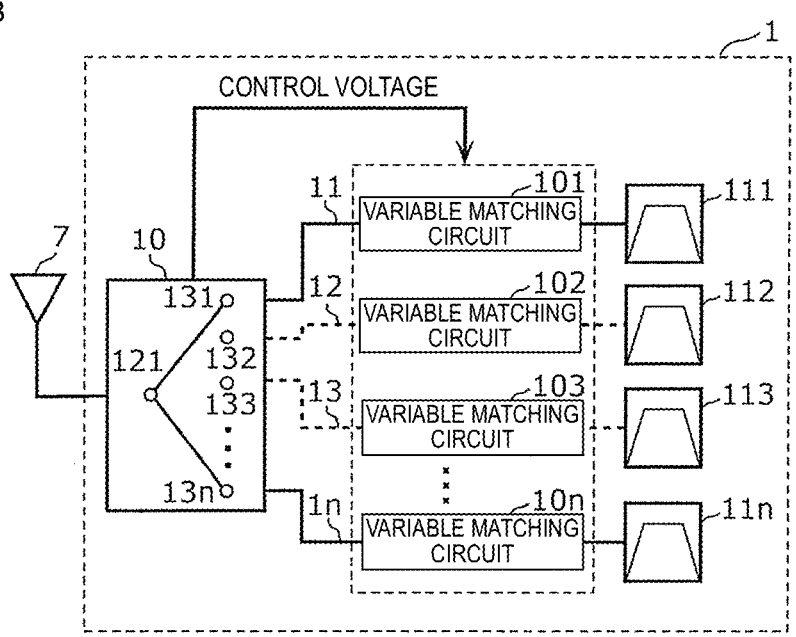
FIG. 1B is a circuit diagram illustrating another CA operation of the radio-frequency module according to the first preferred embodiment of the present invention.

FIG. 1A is a circuit diagram illustrating a CA operation of a radio-frequency module 1 according to a first preferred embodiment of the present invention. FIG. 1B is a circuit diagram illustrating another CA operation of the radio-frequency module according to the first preferred embodiment. In FIGS. 1A and 1B, the radio-frequency module 1 according to the first preferred embodiment and an antenna element 7 are shown. The radio-frequency module 1 and the antenna element 7 are disposed in a front-end portion of a multimode- and/or multiband-support cellular phone, for example.

The radio-frequency module 1 includes a switch circuit 10, signal paths 11, 12, 13, . . . , and 1n that propagate signals of first, second, third, . . . , and n-th (n is a natural number of three or greater) frequency bands, variable matching circuits 101, 102, 103, . . . , and 10n, and band pass filters 111, 112, 113, . . . , and 11n. The radio-frequency module 1 is preferably a multicarrier sending-and-receiving device including a plurality of signal paths to send and receive wireless signals by using multiple frequency bands to support multiple modes and/or multiple bands.

In order to improve the communication quality, the radio-frequency module 1 according to the present preferred embodiment utilizes carrier aggregation (CA) in which communication is performed by simultaneously using at least two frequency bands selected from multiple frequency bands having different frequencies. FIG. 1A illustrates an example in which the first and third frequency bands selected from the first through n-th frequency bands are being used simultaneously. FIG. 1B illustrates an example in which the first and n-th frequency bands selected from the first through n-th frequency bands are being used simultaneously.

The switch circuit 10 includes one input terminal 121 and n output terminals 131, 132, 133, . . . , and 13n, and simultaneously connects the input terminal 121 and each of two or more output terminals selected from the output terminals 131 through 13n. The input terminal 121 is connected to the antenna element 7, while the output terminals 131 through 13n are connected to the signal paths 11 through 1n based on a one-to-one correspondence. In the present preferred embodiment, in FIG. 1A, the input terminal 121 is connected to the output terminal 131 and is also connected to the output terminal 133, while, in FIG. 1B, the input terminal 121 is connected to the output terminal 131 and is also connected to the output terminal 13n. That is, the switch circuit 10 switches the connection between the antenna element 7 and the plurality of signal paths 11 through 1n by connecting the antenna element 7 and at least two of the plurality of signal paths 11 through 1n.

The switch circuit 10 outputs a control signal (control voltage) indicating the connection relationship between the input terminal 121 and the output terminals 131 through 13n to the variable matching circuits 101 through 10n.

The signal paths 11 through 1n are signal transmission paths that propagate signals of corresponding frequency bands selected from multiple frequency bands. The signal paths 11 through 1n are connected to the band pass filters 111 through 11n based on a one-to-one correspondence.

The band pass filters 111 through 11n are filter elements that allow signals of the corresponding frequency bands to selectively pass therethrough. The band pass filters 111 through 11n are connected to a receiving amplifier circuit that amplifies a signal received by the antenna element 7 or a sending amplifier circuit that amplifies a signal to be sent from the antenna element in advance, though such a receiving amplifier circuit or a sending amplifier circuit is not shown. The band pass filters 111 through 11n allow signal components within the corresponding frequency bands to pass therethrough with a small loss and attenuate signal components within the frequency bands other than the corresponding frequency bands at a high level.

The variable matching circuits 101 through 10n are components of the radio-frequency module 1 according to the present preferred embodiment and are disposed in association with the signal paths 11 through 1n based on a one-to-one correspondence. The circuit state of each of the variable matching circuits 101 through 10n is changed in accordance with a selected combination of two or more signal paths simultaneously connected to the input terminal 121. As a result, high transmission performance for sent signals or received signals propagating through simultaneously connected signal paths is able to be maintained in response to a change in the combination of frequency bands operating in the CA mode.

More specifically, the variable matching circuits 101 through 10n each receive a control signal indicating selection information concerning two or more signal paths used to simultaneously communicate from the switch circuit 10, and the circuit state of each of the variable matching circuits 101 through 10n is changed based on this control signal. The variable matching circuits 101 through 10n obtain this control signal from the switch circuit 10 connected to the associated signal paths, so that the transmission path of the control signal is able to be short. It is thus possible to reduce the size of the radio-frequency module.

Figure 2:
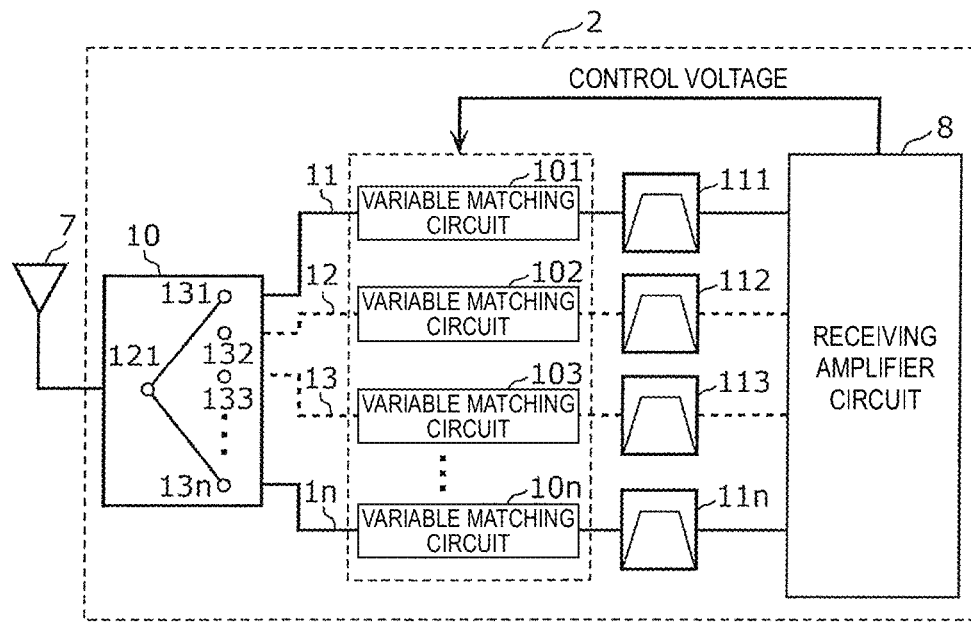
FIG. 2 is a circuit diagram of a radio-frequency module according to a first modified example of the first preferred embodiment of the present invention.

FIG. 2 is a circuit diagram of a radio-frequency module 2 according to a first modified example of the first preferred embodiment. The radio-frequency module 2 shown in FIG. 2 is different from the radio-frequency module 1 in that a receiving amplifier circuit 8 is provided and the transmission path of a control signal is different. Concerning the radio-frequency module 2 according to this modified example, different points from the radio-frequency module 1 according to the first preferred embodiment will primarily be discussed, and an explanation of the same points as the radio-frequency module 1 will be omitted.

The radio-frequency module 2 includes a switch circuit 10, signal paths 11, 12, 13, ..., and 1n that propagate signals of first, second, third, ..., and n-th (n is a natural number of three or greater) frequency bands, variable matching circuits 101, 102, 103, ..., and 10n, band pass filters 111, 112, 113, ..., and 11n, and a receiving amplifier circuit 8.

The receiving amplifier circuit 8 is preferably an amplifier circuit which is connected to the band pass filters 111 through 11n disposed within the signal paths 11 through 1n, respectively, and which amplifies signals of corresponding frequency bands. The receiving amplifier circuit 8 is preferably, for example, a low noise amplifier that amplifies with low noise a received signal propagating from the switch circuit 10. The receiving amplifier circuit 8 also outputs a control signal indicating selection information concerning two or more signal paths used to simultaneously communicate to the variable matching circuits 101 through 10n.

The circuit state of each of the variable matching circuits 101 through 10n is changed based on the control signal received from the receiving amplifier circuit 8. As a result, high transmission performance for sent signals or received signals propagating through simultaneously connected signal paths is able to be maintained in response to a change in the combination of frequency bands operating in the CA mode.

More specifically, the variable matching circuits 101 through 10n each receive a control signal indicating selection information concerning two or more signal paths used to simultaneously communicate from the receiving amplifier circuit 8, and the circuit state of each of the variable matching circuits 101 through 10n is changed based on this control signal. The variable matching circuits 101 through 10n obtain this control signal from the receiving amplifier circuit 8 connected to the associated signal paths, so that the transmission path of the control signal is able to be short. It is thus possible to reduce the size of the radio-frequency module.

In the radio-frequency modules 1 and 2 according to the present preferred embodiment, a variable matching circuit is provided in each of the signal paths 11 through 1n. However, a variable matching circuit may be provided only in at least one of plurality of signal paths operating in the CA mode.

Figure 3A:
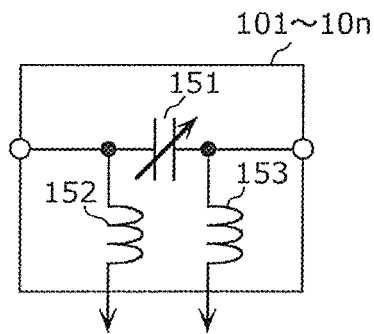
FIG. 3A is a specific circuit diagram of variable matching circuits according to the first preferred embodiment of the present invention.

FIG. 3A is a specific circuit diagram of the variable matching circuits 101 through 10n according to the first preferred embodiment. In FIG. 3A, the circuit configuration of the variable matching circuits 101 through 10n included in the radio-frequency modules 1 and 2 is shown. Each of the variable matching circuits 101 through 10n preferably includes a variable capacitor element 151 and inductance element 152 and 153.

The variable capacitor element 151 is a circuit element whose electrostatic capacitance is changed by the application of a control voltage. The variable capacitor element 151 is directly inserted into each of the signal paths 11 through 11n in series with each other. The variable capacitor element 151 is preferably a variable capacitor diode, for example. The inductance elements 152 and 153 sandwich the variable capacitor element 151 therebetween and are each disposed between a signal path and a reference terminal.

The electrostatic capacitance of the variable capacitor element 151 and the inductance value of the inductance elements 152 and 153 may differ according to the signal path.

With the above-described circuit configuration, the capacitance value of the variable capacitor element 151 is changed in accordance with the control voltage supplied from the switch circuit 10 or the receiving amplifier circuit 8. This makes it possible to always adjust the impedance of the pass band to the characteristic impedance in response to a change in the combination of two or more signal paths operating in the CA mode, in a state in which two or more filter elements disposed in two or more signal paths operating in the CA mode are connected to these signal paths by the use of the switch circuit 10.

Figure 3B:
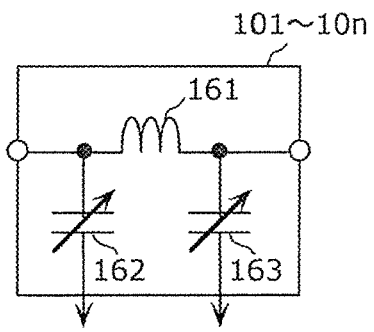
FIG. 3B is a specific circuit diagram of variable matching circuits according to a second modified example of the first preferred embodiment of the present invention.

FIG. 3B is a specific circuit diagram of the variable matching circuits 101 through 10n according to the first modified example of the first preferred embodiment. In FIG. 3B, a modified example of the circuit configuration of the variable matching circuits 101 through 10n included in the radio-frequency module 1 or 2 is shown. Each of the variable matching circuits 101 through 10n includes an inductance element 161 and variable capacitor elements 162 and 163.

The inductance element 161 is directly inserted into each of the signal paths 11 through 11n in series with each other. The variable capacitor elements 162 and 163 are circuit elements whose electrostatic capacitance is changed by the application of a control voltage. The variable capacitor elements 162 and 163 sandwich the inductance element 161 therebetween and are each disposed between a signal path and a reference terminal. The variable capacitor elements 162 and 163 are preferably variable capacitor diodes, for example.

The inductance value of the inductance element 161 and the electrostatic capacitance of the variable capacitor elements 162 and 163 may differ according to the signal path.

With the above-described circuit configuration, the capacitance value of the variable capacitor elements 162 and 163 is changed in accordance with the control voltage supplied from the switch circuit 10 or the receiving amplifier circuit 8. This makes it possible to always adjust the impedance of the pass band to the characteristic impedance in response to a change in the combination of two or more signal paths operating in the CA mode, in a state in which two or more filter elements disposed in two or more signal paths operating in the CA mode are connected to these signal paths by the use of the switch circuit 10.

In the circuit configurations in FIGS. 3A and 3B, the switch circuit 10 or the receiving amplifier circuit 8 which outputs the above-described control voltage preferably includes an association table indicating the relationship between information concerning a combination of two or more signal paths operating in the CA mode and the control voltage to be applied to the variable capacitor element of the variable matching circuit. Alternatively, the radio-frequency modules 1 and 2 may include this association table, and the switch circuit 10 or the receiving amplifier circuit may refer to this association table and output the control voltage to the variable matching circuit.

In a CA-support communication system, it is necessary to use a single-input multiple-output (SPnT) switch as a switch circuit in association with a single antenna element. However, if a single-input multiple-output switch is simply connected to filter elements of the subsequent stage, when two or more signal paths are simultaneously connected, the filter element disposed in one signal path is influenced by the filter element disposed in another signal path. As a result, the bandpass characteristics are decreased. To avoid such deterioration in the bandpass characteristics, it is necessary to perform phase and impedance adjustments so that the filter element disposed in one signal path will not be influenced by the filter element disposed in another signal path.

If the combination of two or more signal paths to be simultaneously connected is fixed, phase and impedance adjustments are able to be performed merely by disposing a fixed matching circuit in each signal path.

However, if there are a plurality of combinations of two or more signal paths to be simultaneously connected and if the combination of such signal paths to be selected is changed, providing matching circuits suitable only for a specific combination of signal paths fails to perform phase and impedance adjustments suitable for all the combinations. For example, in the case of performing communication by simultaneously using two frequency bands selected from three different frequency bands, two different matching circuits are required for each signal path. In the case of performing communication by simultaneously using three frequency bands selected from multiple different frequency bands, an enormous number of combinations of frequency bands may be considered. It is thus practically impossible to provide matching circuits in association with the number of combinations of frequency bands in terms of the saving of the space of the front-end portion.

In contrast, in the radio-frequency modules 1 and 2 according to the present preferred embodiment, the circuit state of each variable matching circuit is changed in accordance with the combination of two or more signal paths simultaneously connected in the CA mode. It is thus less likely that the bandpass characteristics of the filter element disposed in one of the selected two or more signal paths will be decreased because of the influence of the filter element disposed in another signal path. As a result, high transmission performance for sent signals or received signals propagating through two or more simultaneously connected signal paths is able to be maintained in response to a change in the combination of frequency bands operating in the CA mode. Additionally, the switch circuit is capable of simultaneously connecting two or more signal paths by using only one input terminal, thus making it possible to provide a small radio-frequency module.

In the first preferred embodiment, the radio-frequency modules 1 and 2 are preferably operated in the CA mode. However, the radio-frequency modules 1 and 2 according to the present preferred embodiment may not be operated in the CA mode. That is, the radio-frequency modules 1 and 2 may include, not only a CA mode, but also a non-CA mode in which one frequency band is selected from multiple frequency bands and is used depending on the communication status. If the non-CA mode is selected, the switch circuit 10 connects the input terminal 121 to a selected one of the output terminals 131 through 13$n$. In other words, the switch circuit 10 having a function of simultaneously connecting the input terminal and each of at least two output terminals may also have a function of switching between the CA mode and the non-CA mode.

The band pass filters 111 through 11$n$ may be low pass filters or high pass filters according to the frequency configuration of each frequency band and the requested specifications.

At least one of the signal paths 11 through 11$n$ may preferably branch to a received-signal path to propagate a signal received via the switch circuit 10 to a receiving amplifier circuit of the subsequent stage and to a sending-signal path to propagate a sent signal from a sending amplifier circuit to the switch circuit 10. In this case, if the frequency division duplexing (FDD) method is applied to the signal path which branches to the received-signal path and the sending-signal path, a duplexer may preferably be disposed at a branch point between the received-signal path and the sending-signal path, instead of a band pass filter.

The frequency bandwidth in a signal path used in the FDD method for simultaneously propagating both of a sent signal and a received signal is wider than that in a signal path to propagate only a sent signal or a received signal. For this reason, it is more difficult to provide impedance matching for a duplexer than that for a single filter. A greater degree of impedance mismatching may occur in a duplexer when the combination of frequency bands operating in the CA mode is changed. From this perspective, it is preferable that impedance matching is effectively provided for duplexers disposed in signal paths operating in the CA mode by using the variable matching circuits 101 through 10$n$ of this preferred embodiment.

Characteristics of an example of the radio-frequency module 1 according to the first preferred embodiment and those of a comparative example will be compared.

Figure 4:
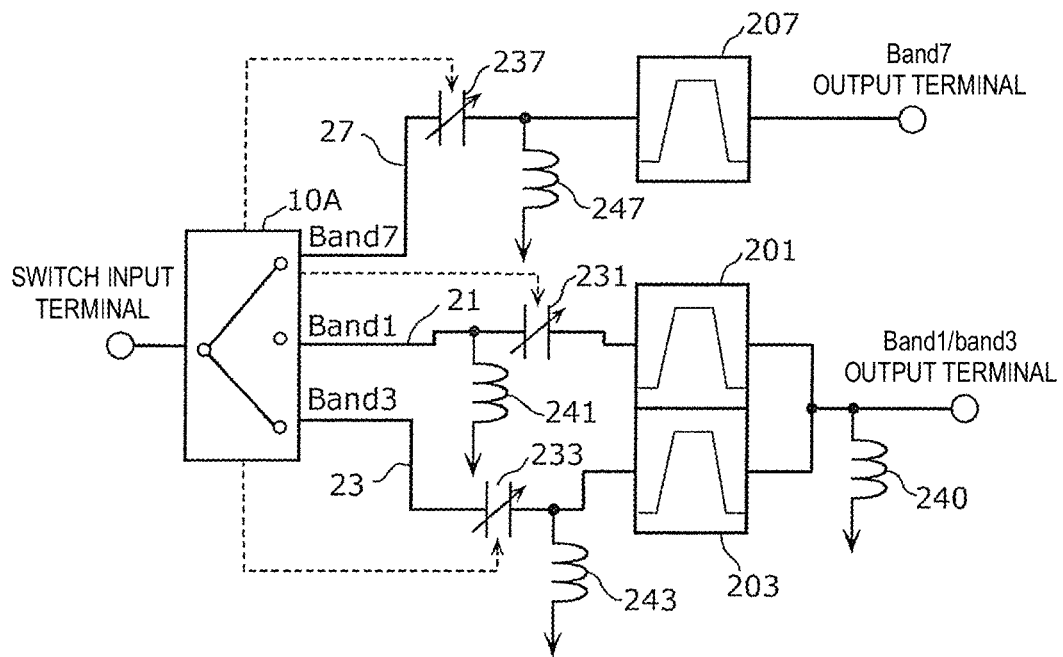
FIG. 4 is a circuit diagram of a radio-frequency module according to an example of a preferred embodiment of the present invention.

FIG. 4 is a circuit diagram of a radio-frequency module according to an example of a preferred embodiment of the present invention. In FIG. 4, a circuit diagram of an example of the radio-frequency module 1 according to the first preferred embodiment is shown.

The radio-frequency module according to this example includes a switch circuit 10A, a received-signal path 21 that propagates a received signal of Band1 (transmit band: 1920 MHz to 1980 MHz, receive band: 2110 MHz to 2170 MHz) of the LTE (Long Term Evolution) standard, a received-signal path 23 that propagates a received signal of Band3 (transmit band: 1710 MHz to 1785 MHz, receive band: 1805 MHz to 1880 MHz) of the LTE standard, a received-signal path 27 that propagates a received signal of Band7 (transmit band: 2500 MHz to 2570 MHz, receive band: 2620 MHz to 2690 MHz) of the LTE standard, variable capacitor elements 231, 233, and 237, inductance elements 241, 243, and 247, band pass filters 201, 203, and 207, and a matching inductance element 240.

The radio-frequency module of this example utilizes carrier aggregation in which communication is performed by simultaneously using any of two frequency bands selected from three frequency bands.

The switch circuit 10A is a switch which includes one input terminal and three output terminals and which simultaneously connects the input terminal and each of two output terminals selected from the three output terminals. The input terminal is connected to an antenna element, while the three output terminals are connected to the associated received-signal paths 21, 23, and 27. That is, in the CA operation mode, combinations of frequency bands are Band1 and Band3, Band3 and Band7, and Band7 and Band1.

A control signal (control voltage), which indicates the connection relationship between the input terminal and the three output terminals, output from the switch circuit 10A is applied to the variable capacitor elements 231, 233, and 237.

The received-signal paths 21, 23, and 27 are received-signal transmission paths that propagate received signals of Band1, Band3, and Band7, respectively. The received-signal paths 21, 23, and 27 are connected to the band pass filters 201, 203, and 207, respectively.

The band pass filters 201, 203, and 207 are filter elements that allow signals of corresponding frequency bands to selectively pass therethrough. The band pass filter 207 is connected to a Band7 output terminal by the received-signal path 21. The band pass filters 201 and 203 are connected to a Band1/Band3 output terminal by a common path used for both of the received-signal paths 21 and 23.

The variable capacitor element 237 and the inductance element 247 define a variable matching circuit provided in the received-signal path 27 of Band7. The variable capacitor element 231 and the inductance element 241 define a variable matching circuit provided in the received-signal path 21 of Band1. The variable capacitor element 233 and the inductance element 243 define a variable matching circuit provided in the received-signal path 23 of Band3. The variable capacitor elements 231, 233, and 237 each receive a control signal indicating selection information concerning two signal paths that simultaneously communicate from the switch circuit 10A, and the electrostatic capacitance value of each of the variable capacitor elements 231, 233, and 237 is changed based on this control signal. That is, in the radio-frequency module of this example, the electrostatic capacitance values of the variable capacitor elements 231, 233, and 237 vary in response to a change in the combination of frequency bands operating in the CA mode so that the impedance of the pass band of each of the band pass filters 201, 203, and 207 is able to be adjusted to the characteristic impedance. More specifically, the switch circuit 10A outputs a control voltage to be applied to the variable capacitor elements in accordance with the combination of two received-signal paths to be simultaneously connected so that, concerning the band pass filter disposed in one signal path, the impedance of the pass band of this band pass filter is able to be adjusted to the characteristic impedance (the standing wave ratio is decreased) and the impedance outside this pass band (the pass band of the band pass filter disposed in the other signal path) is able to be in the open state.

Figure 5A:
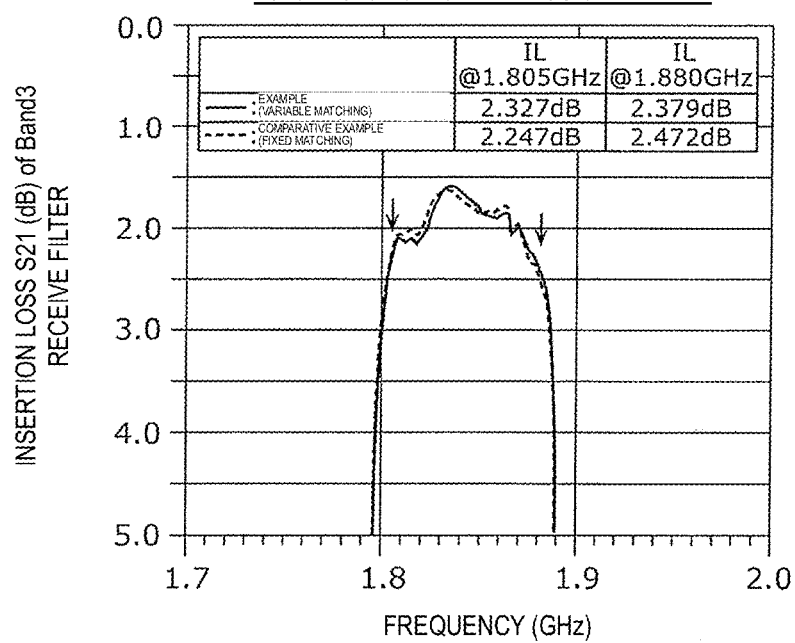
FIG. 5A is a graph illustrating a comparison between the bandpass characteristics of the example and those of a comparative example when Band3 and Band1 are simultaneously used.

FIG. 5A is a graph illustrating a comparison between the bandpass characteristics of the example and those of a comparative example when Band3 and Band1 are simultaneously used. More specifically, FIG. 5A illustrates the bandpass characteristics of the band pass filter 203 of Band3 in this example (variable matching) and those of a band pass filter of Band3 in the comparative example (fixed matching).

Figure 5B:
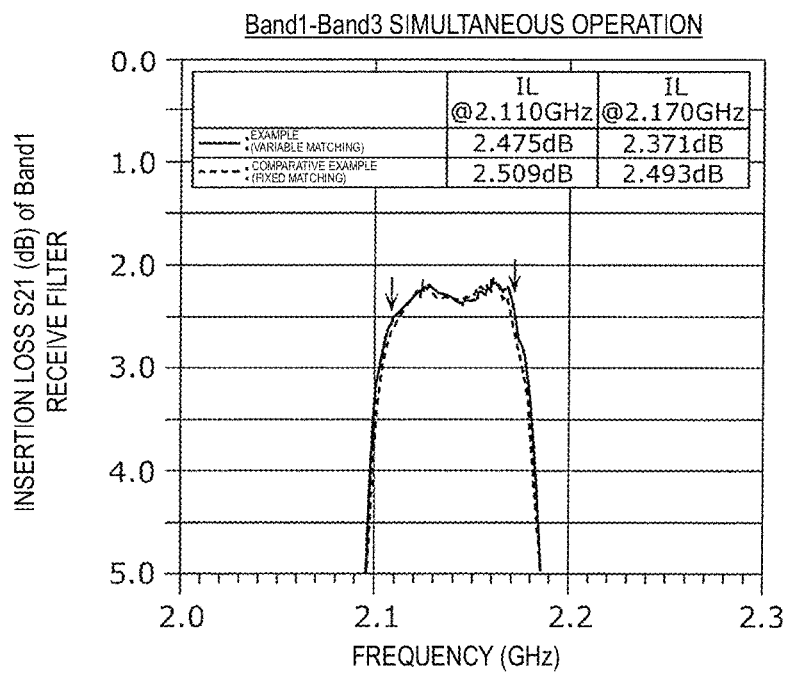
FIG. 5B is a graph illustrating a comparison between the bandpass characteristics of the example and those of the comparative example when Band1 and Band3 are simultaneously used.

FIG. 5B is a graph illustrating a comparison between the bandpass characteristics of the example and those of the comparative example when Band1 and Band3 are simultaneously used. More specifically, FIG. 5B illustrates the bandpass characteristics of the band pass filter 201 of Band1 in this example (variable matching) and those of a band pass filter of Band1 in the comparative example (fixed matching).

The bandpass characteristics of this example represented by FIGS. 5A and 5B are those of the band pass filters 203 and 201 of Band3 and Band1, respectively, when the electrostatic capacitance values of the variable capacitor elements are changed in accordance with the combination of frequency bands to simultaneously receive signals (variable matching) in the circuit configuration shown in FIG. 4.

The bandpass characteristics of the comparative example represented by FIGS. 5A and 5B are those of the band pass filters of Band3 and Band1, respectively, when the electrostatic capacitance values of the variable capacitor elements are fixed regardless of which combination of frequency bands to simultaneously receive signals is used (fixed matching) in the circuit configuration shown in FIG. 4.

Table 1 indicates optimal values of the variable capacitor elements and the inductance elements set in the example and the comparative example.

TABLE 1

|  | Example (variable matching) | | | Comparative example (fixed matching) |
| --- | --- | --- | --- | --- |
|  | CA (B1-B3) | CA (B1-B7) | CA (B3-B7) | |
| B7 variable capacitor element 237 (pF) | 50 | 12 | 24 | 50 |
| B7 inductance element 247 (nH) | 3.0 | 3.0 | 3.0 | 3.0 |
| B1 variable capacitor element 231 (pF) | 12.0 | 5.0 | 1.8 | 5.0 |
| B1 inductance element 241 (nH) | 4.2 | 4.2 | 4.2 | 4.2 |
| B3 variable capacitor element 233 (pF) | 7.0 | 1.6 | 1.6 | 2.3 |
| B3 inductance element 243 (nH) | 4.4 | 4.4 | 4.4 | 4.4 |

Table 1 shows that, in the comparative example, the electrostatic capacitance values of the variable capacitor elements 237, 231, and 233 are fixed at about 50 pF, about 5.0 pF, and about 2.3 pF, respectively, regardless of which combination of frequency bands to operate in the CA mode is used. In contrast, in the example, the electrostatic capacitance values of the variable capacitor elements 237, 231, and 233 are optimized in accordance with the combination of frequency bands to operate in the CA mode.

As shown in FIG. 5A, concerning the band pass filter 203 of Band3, the maximum value of the insertion loss in the receive band of Band3 in the example is reduced to about 2.379 dB (1.880 GHz), in contrast to about 2.472 dB (1.880 GHz) in the comparative example. As shown in FIG. 5B, concerning the band pass filter 201 of Band1, the maximum value of the insertion loss in the receive band of Band1 in the example is reduced to about 2.475 dB (2.110 GHz), in contrast to about 2.509 dB (2.110 GHz) in the comparative example.

As described above, in the radio-frequency module of this example, as indicated in Table 1, the electrostatic capacitance values of the variable capacitor elements are changed in accordance with the combination of two signal paths to be simultaneously connected in the CA mode. The circuit state of the variable matching circuit disposed in each signal path is thus changed in accordance with the combination of two signal paths to be simultaneously connected in the CA mode. It is thus less likely that the bandpass characteristics of the filter element disposed in one of the above-described two signal paths will be decreased because of the influence of the filter element disposed in the other signal path. As a result, high transmission performance for received signals propagating through two simultaneously connected signal paths is able to be maintained, as shown in FIGS. 5A and 5B, in response to a change in the combination of frequency bands operating in the CA mode. Additionally, the switch circuit 10A is capable of simultaneously connecting two or more received-signal paths by using only one input terminal, thus making it possible to provide a small radio-frequency module.

Second Preferred Embodiment

A radio-frequency module 3 according to a second preferred embodiment of the present invention is different from the radio-frequency module 1 according to the first preferred embodiment in that variable phase circuits are provided as the variable matching circuit. Concerning the radio-frequency module 3 according to this preferred embodiment, different points from the radio-frequency module 1 according to the first preferred embodiment will primarily be discussed, and an explanation of the same points as the radio-frequency module 1 will be omitted.

Figure 6:
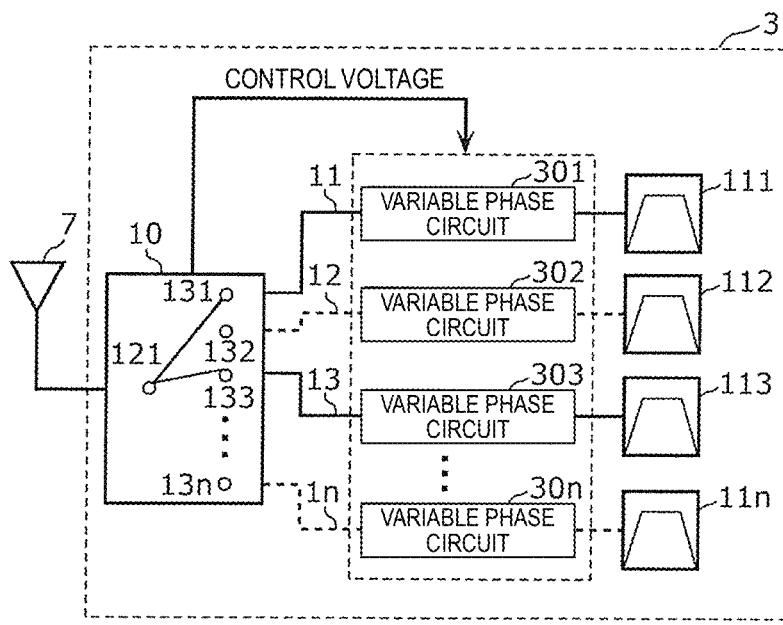
FIG. 6 is a circuit diagram of a radio-frequency module according to a second preferred embodiment of the present invention.

FIG. 6 is a circuit diagram of the radio-frequency module 3 according to the second preferred embodiment. In FIG. 6, the radio-frequency module 3 according to the second preferred embodiment and an antenna element 7 are shown. The radio-frequency module 3 and the antenna element 7 are disposed in a front-end portion of a multimode- and/or multiband-support cellular phone, for example.

The radio-frequency module 3 includes a switch circuit 10, signal paths 11, 12, 13, . . . , and 1n that propagate signals of first, second, third, . . . , and n-th (n is a natural number of three or greater) frequency bands, variable phase circuits 301, 302, 303, . . . , and 30n, and band pass filters 111, 112, 113, . . . , and 11n.

In order to improve the communication quality, the radio-frequency module 3 according to the second preferred embodiment utilizes carrier aggregation in which communication is performed by simultaneously using at least two frequency bands selected from multiple frequency bands having different frequencies.

The switch circuit 10 outputs a control signal (control voltage) indicating the connection relationship between the input terminal and the output terminals to the variable phase circuits 301 through 30n.

The variable phase circuits 301 through 30n are preferred components of the radio-frequency module 3 according to the second preferred embodiment and are disposed in association with the signal paths 11 through 1n, respectively. Each of the variable phase circuits 301 through 30n is one example of a variable matching circuit whose circuit state is changed in accordance with the selected combination of two or more signal paths simultaneously connected to the input terminal of the switch circuit 10. As a result, high transmission performance for sent signals or received signals propagating through simultaneously connected signal paths is able to be maintained in response to a change in the combination of frequency bands operating in the CA mode.

The variable phase circuits 301 through 30n obtain the above-described control signal from the switch circuit 10 connected to the associated signal paths, so that the transmission path for the control signal is able to be short. It is thus possible to reduce the size of the radio-frequency module.

In the radio-frequency module 3 according to the present preferred embodiment, a variable phase circuit is preferably provided in each of the signal paths 11 through 1n. However, a variable phase circuit may be provided only in at least one of a plurality of signal paths operating in the CA mode.

Figure 7:
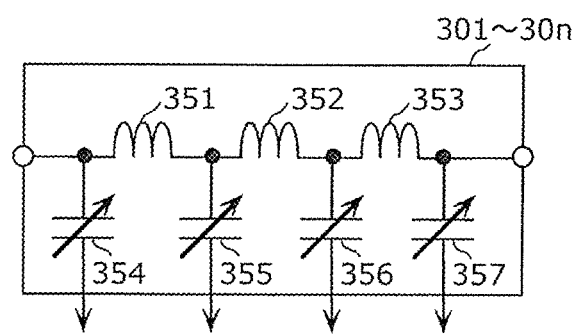
FIG. 7 is a specific circuit diagram of variable phase circuits according to the second preferred embodiment of the present invention.

FIG. 7 is a specific circuit diagram of the variable phase circuits 301 through 30n according to the second preferred embodiment. In FIG. 7, the circuit configuration of the variable phase circuits 301 through 30n included in the radio-frequency module 3 is shown. Each of the variable phase circuits 301 through 30n includes inductance elements 351, 352, and 353 and variable capacitor elements 354, 355, 356, and 357.

The inductance elements 351, 352, and 353 are connected in series with each other and are directly inserted into each of the signal paths 11 through 11n in series with each other.

The variable capacitor elements 354 through 357 are circuit elements whose electrostatic capacitance is changed by the application of a control voltage. The variable capacitor elements 354 through 357 are each disposed between a reference terminal and a connection node between a corresponding one of the inductance elements 351 through 353 and a signal path. The variable capacitor elements 354 through 357 are preferably variable capacitor diodes, for example.

The inductance value of the inductance elements 351 through 353 and the electrostatic capacitance of the variable capacitor elements 354 through 357 may differ according to the signal path.

With the above-described circuit configuration, the electrostatic capacitance value of the variable capacitor elements 354 through 357 is changed in accordance with the control voltage supplied from the switch circuit 10. With this configuration, in response to a change in the combination of two or more signal paths operating in the CA mode, it is possible to vary the phase of sent signals or received signals propagating through the simultaneously connected signal paths in a state in which two or more filter elements are connected to these signal paths by the use of the switch circuit 10. In this case, in response to a change in the combination of two or more signal paths, concerning the filter element disposed in one of the selected two or more signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

Third Preferred Embodiment

A radio-frequency module 4 according to a third preferred embodiment of the present invention is different from the radio-frequency module 1 according to the first preferred embodiment in that variable LC resonance circuits are provided as one example of the variable matching circuit. Concerning the radio-frequency module 4 according to the third preferred embodiment, different points from the radio-frequency module 1 according to the first preferred embodiment will primarily be described, and an explanation of the same points as the radio-frequency module 1 will be omitted.

Figure 8:
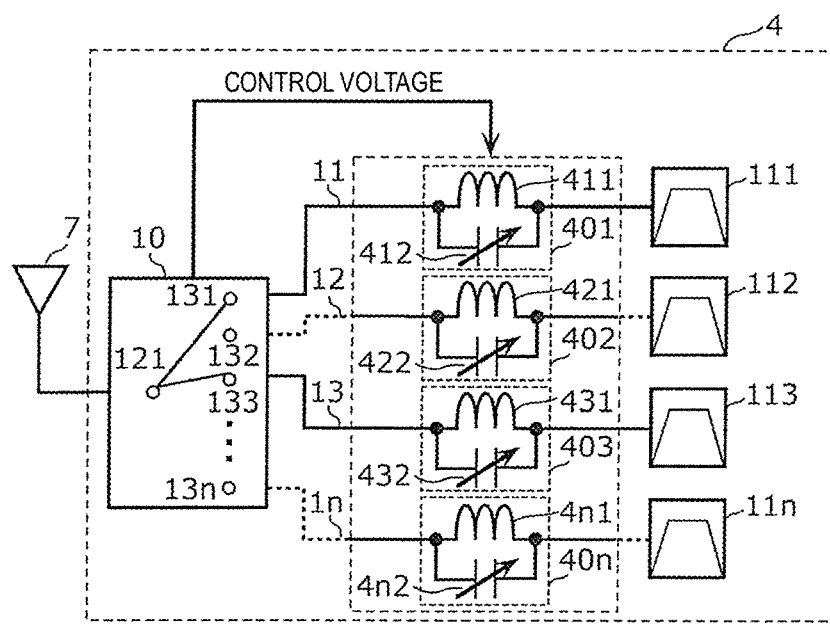
FIG. 8 is a circuit diagram of a radio-frequency module according to a third preferred embodiment of the present invention.

FIG. 8 is a circuit diagram of the radio-frequency module 4 according to the third preferred embodiment. In FIG. 8, the radio-frequency module 4 according to the third preferred embodiment and an antenna element 7 are shown. The radio-frequency module 4 and the antenna element 7 are disposed in a front-end portion of a multimode- and/or multiband-support cellular phone, for example.

The radio-frequency module 4 includes a switch circuit 10, signal paths 11, 12, 13, . . . , and 1n that propagate signals of first, second, third, . . . , and n-th (n is a natural number of three or greater) frequency bands, variable LC resonance circuits 401, 402, 403, . . . , and 40n, and band pass filters 111, 112, 113, . . . , and 11n.

In order to improve the communication quality, the radio-frequency module 4 according to this preferred embodiment utilizes carrier aggregation in which communication is performed by simultaneously using at least two frequency bands selected from multiple frequency bands having different frequencies.

The switch circuit 10 outputs a control signal (control voltage) indicating the connection relationship between the input terminal and the output terminals to the variable LC resonance circuits 401 through 40n.

The variable LC resonance circuits 401 through 40n are preferred components of the radio-frequency module 4 according to this preferred embodiment and are disposed in association with the signal paths 11 through 1n, respectively. Each of the variable LC resonance circuits 401 through 40n is one example of a variable matching circuit whose circuit state is changed in accordance with a selected combination of two or more signal paths simultaneously connected to the input terminal of the switch circuit 10. As a result, high transmission performance for sent signals or received signals propagating through simultaneously connected signal paths is able to be maintained in response to a change in the combination of frequency bands operating in the CA mode.

The variable LC resonance circuits 401 through 40n obtain the above-described control signal from the switch circuit connected to the associated signal paths, so that the transmission path for the control signal is able to be short. It is thus possible to reduce the size of the radio-frequency module.

In the radio-frequency module 4 according to the present preferred embodiment, a variable LC resonance circuit is preferably provided in each of the signal paths 11 through 1n. However, a variable LC resonance circuit may be provided only in at least one of a plurality signal paths operating in the CA mode.

As shown in FIG. 8, each of the variable LC resonance circuits 401 through 40n included in the radio-frequency module 4 is preferably defined by an inductance element and a variable capacitor element connected in parallel with each other. The variable LC resonance circuit 401 includes an inductance element 411 and a variable capacitor element 412. The variable LC resonance circuit 402 includes an inductance element 421 and a variable capacitor element 422. The variable LC resonance circuit 403 includes an inductance element 431 and a variable capacitor element 432. The variable LC resonance circuit 40n includes an inductance element 4n1 and a variable capacitor element 4n2.

The variable capacitor elements 412, 422, 432, . . . , and 4n2 are circuit elements whose electrostatic capacitance is changed by the application of a control voltage. The variable capacitor elements 412, 422, 432, . . . , and 4n2 are preferably variable capacitor diodes, for example.

With the above-described circuit configuration, the electrostatic capacitance values of the variable capacitor elements 412 through 4n2 are changed in accordance with the control voltage supplied from the switch circuit 10. With this configuration, in response to a change in the combination of two or more signal paths operating in the CA mode, the LC resonant frequency of variable LC resonance circuits connected to the simultaneously connected signal paths is able to be changed in a state in which two or more filter elements are connected to these signal paths by the use of the switch circuit 10. In this case, concerning the filter element disposed in one of selected two or more signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

Fourth Preferred Embodiment

A radio-frequency module 5 according to a fourth preferred embodiment of the present invention is different from the radio-frequency module 1 according to the first preferred embodiment in that variable elastic wave resonance circuits are provided as one example of the variable matching circuit. Concerning the radio-frequency module 5 according to the fourth preferred embodiment, different points from the radio-frequency module 1 according to the first preferred embodiment will primarily be discussed, and an explanation of the same points as the radio-frequency module 1 will be omitted.

Figure 9:
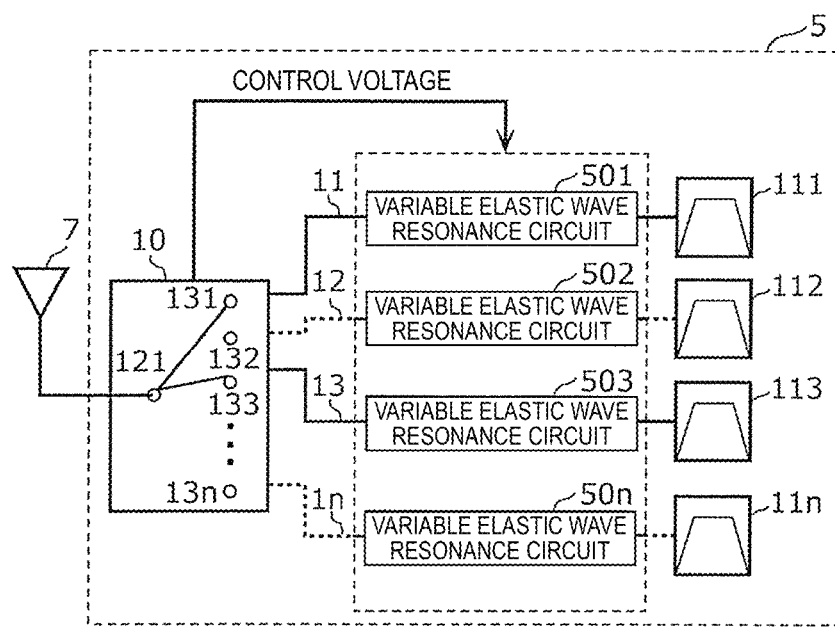
FIG. 9 is a circuit diagram of a radio-frequency module according to a fourth preferred embodiment of the present invention.

FIG. 9 is a circuit diagram of the radio-frequency module 5 according to the fourth preferred embodiment. In FIG. 9, the radio-frequency module 5 according to the fourth preferred embodiment and an antenna element 7 are shown. The radio-frequency module 5 and the antenna element 7 are disposed in a front-end portion of a multimode- and/or multiband-support cellular phone, for example.

The radio-frequency module 5 includes a switch circuit 10, signal paths 11, 12, 13, . . . , and 1n that propagate signals of first, second, third, . . . , and n-th (n is a natural number of three or greater) frequency bands, variable elastic wave resonance circuits 501, 502, 503, . . . , and 50n, and band pass filters 111, 112, 113, . . . , and 11n.

In order to improve the communication quality, the radio-frequency module 5 according to the fourth preferred embodiment utilizes carrier aggregation in which communication is performed by simultaneously using at least two frequency bands selected from multiple frequency bands having different frequencies.

The switch circuit 10 outputs a control signal (control voltage) indicating the connection relationship between the input terminal and the output terminals to the variable elastic wave resonance circuits 501 through 50n.

The variable elastic wave resonance circuits 501 through 50n are preferable components of the radio-frequency module 5 according to the present preferred embodiment and are disposed in association with the signal paths 11 through 1n, respectively. Each of the variable elastic wave resonance circuits 501 through 50n is one example of a variable matching circuit whose circuit state is changed in accordance with a selected combination of two or more signal paths simultaneously connected to the input terminal of the switch circuit 10. As a result, high transmission performance for sent signals or received signals propagating through simultaneously connected signal paths is able to be maintained in response to a change in the combination of frequency bands operating in the CA mode.

The variable elastic wave resonance circuits 501 through 50n obtain the above-described control signal from the switch circuit 10 connected to the associated signal paths, so that the transmission path for the control signal is able to be short. It is thus possible to reduce the size of the radio-frequency module.

In the radio-frequency module 5 according to the present preferred embodiment, a variable elastic wave resonance circuit is preferably provided in each of the signal paths 11 through 1n. However, a variable elastic wave resonance circuit may be provided only in at least one of a plurality of signal paths operating in the CA mode.

Figure 10:
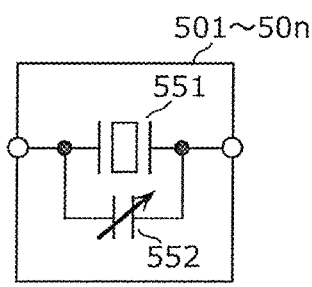
FIG. 10 is a specific circuit diagram of variable elastic wave resonance circuits according to the fourth preferred embodiment of the present invention.

FIG. 10 is a circuit diagram of the variable elastic wave resonance circuits 501 through 50n according to the fourth preferred embodiment. In FIG. 10, the circuit configuration of the variable elastic wave resonance circuits 501 through 50n included in the radio-frequency module 5 is shown. Each of the variable elastic wave resonance circuits 501 through 50n includes an elastic wave resonator 551 and a variable capacitor element 552. The elastic wave resonator 551 and the variable capacitor element 552 are connected in parallel with each other and are inserted into each of the signal paths 11 through 11n.

Examples of the elastic wave resonator 551 are a surface acoustic wave resonator using surface acoustic waves, a BAW (Bulk Acoustic Wave) resonator using bulk waves, and a boundary acoustic wave resonator using boundary acoustic waves.

The variable capacitor element 552 is a circuit element whose electrostatic capacitance is changed by the application of a control voltage. The variable capacitor element 552 is preferably a variable capacitor diode, for example.

Design parameters which determine the capacitance of the elastic wave resonator 551 and the electrostatic capacitance of the variable capacitor element 552 may differ according to the signal path.

With the above-described circuit configuration, the electrostatic capacitance value of the variable capacitor element 552 is changed in accordance with the control voltage supplied from the switch circuit 10. With this configuration, in response to a change in the combination of two or more signal paths operating in the CA mode, the anti-resonant frequencies of elastic wave resonators connected to the simultaneously connected signal paths is able to be changed in a state in which two or more filter elements are connected to these signal paths by the use of the switch circuit 10. In this case, concerning the filter element disposed in one of selected two or more signal paths, the impedance of this filter element is able to be adjusted to the characteristic impedance, and the impedance of the filter element in another signal path is able to always be in the open state. It is thus possible to maintain high transmission performance for sent signals or received signals in response to a change in the combination of frequency bands operating in the CA mode.

Fifth Preferred Embodiment

A radio-frequency module according to a fifth preferred embodiment of the present invention includes a combination of a plurality of variable matching circuits selected from the variable matching circuits discussed in the first through fourth preferred embodiments. Concerning the radio-frequency module according to the fifth preferred embodiment, different points from the radio-frequency modules according to the first through fourth preferred embodiments will primarily be discussed, and an explanation of the same points as the radio-frequency modules according to the first through fourth preferred embodiments will be omitted.

Figure 11:
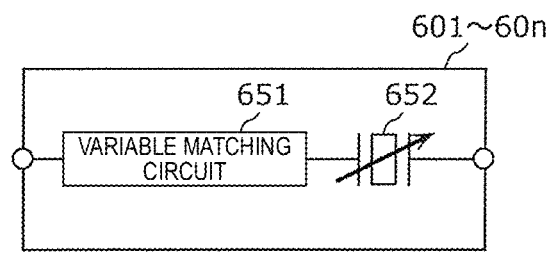
FIG. 11 is a circuit diagram of a variable matching circuit and a variable elastic wave resonance circuit connected in series with each other.

The radio-frequency module according to the present preferred embodiment includes, in each signal path, a variable matching circuit (first variable matching circuit) discussed in one of the first through fourth preferred embodiments and a variable matching circuit (second variable matching circuit) discussed in one of the first through fourth preferred embodiments connected in series with each other. As shown in FIG. 11, for example, the radio-frequency module according to the present preferred embodiment preferably includes the variable matching circuit according to the first preferred embodiment and the variable elastic wave resonance circuit according to the fourth preferred embodiment connected in series with each other.

FIG. 11 is a circuit diagram of a variable matching circuit 651 and a variable elastic wave resonance circuit 652 connected in series with each other. The circuit configuration shown in FIG. 11 may not necessarily be provided in all of the signal paths, and may be provided only in at least one signal path. The combination of series-connected circuits may differ according to the signal path.

With this configuration, more stages of variable matching circuits are provided, and also, multiple different variable matching circuits connected in series with each other are provided, thus improving the degree of matching between simultaneously connected signal paths. This configuration provides matching between simultaneously used frequency bands having a large frequency difference (CA using Band5 and Band1, for example).

The radio-frequency module according to the present preferred embodiment is not limited to the configuration in which two variable matching circuits are connected in series with each other.

For example, the radio-frequency module according to the present preferred embodiment may include, in each signal path, a variable matching circuit (first variable matching circuit) discussed in one of the first through fourth preferred embodiments and a variable matching circuit (second variable matching circuit) discussed in one of the first through fourth preferred embodiments connected in parallel with each other. The circuit configuration including parallel-connected variable matching circuits may not necessarily be provided in all of the signal paths, and may be provided only in at least one signal path. The combination of parallel-connected circuits may differ according to the signal path.

With this configuration, it is possible to reduce a signal transmission loss at a variable matching circuit in a signal path in which it is desired to reduce a signal transmission loss when providing matching between this signal path and another signal path, for example.

In radio-frequency modules according to preferred embodiments the present invention, a variable matching circuit discussed in one of the first through fourth preferred embodiments, a plurality of variable matching circuits connected in series with each other selected from those discussed in one of the first through fourth preferred embodiments, or a plurality of variable matching circuits connected in parallel with each other selected from those discussed in one of the first through fourth preferred embodiments may be provided according to the signal path.

Other Preferred Embodiments

The radio-frequency modules according to the preferred embodiments of the present invention have been discussed through illustration of the first through fifth preferred embodiments and the modified example of the first preferred embodiment. However, the radio-frequency modules of the present invention are not restricted to those in the above-described preferred embodiments and the modified examples. Certain elements in the above-described preferred embodiments and the modified examples may be combined to obtain other preferred embodiments, and various modifications apparent to those skilled in the art may be made to the preferred embodiments or the modified example without departing from the scope and spirit of the invention. Such preferred embodiments and modified examples are also encompassed within the present invention. Additionally, various devices integrating the radio-frequency modules disclosed in the above-described preferred embodiments and modified examples are also encompassed within the present invention.

For example, duplexers may be used instead of the band pass filters included in the radio-frequency modules according to the second through fifth preferred embodiments.

In the radio-frequency modules according to the above-described preferred embodiments and modified examples, other radio-frequency circuit elements and wiring patterns may be inserted in paths connecting the circuit elements and signal paths shown in the drawings.

Preferred embodiments of the present invention may be widely applicable to communication devices, such as, for example, cellular phones, as a multiband- and/or multimode-support front-end module utilizing carrier aggregation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency module comprising:
   a switch circuit that includes one input terminal and three or more output terminals and that allows simultaneous connection between the input terminal and each of two or more output terminals selected from the three or more output terminals;
   at least three filters that are each connected to a corresponding one of the at least three output terminals; and
   a variable matching circuit connected between at least one filter of the at least three filters and the switch circuit; wherein
   the switch circuit controls the variable matching circuit.

2. The radio-frequency module according to claim 1, wherein
   the input terminal of the switch circuit is to be connected to an antenna element.

3. The radio-frequency module according to claim 1, wherein the variable matching circuit includes a variable capacitor element.

4. The radio-frequency module according to claim 3, wherein the switch circuit outputs a control voltage to be applied to the variable capacitor element.

5. The radio-frequency module according to claim 1, wherein the variable matching circuit includes an inductance element.

6. The radio-frequency module according to claim 1, wherein the variable matching circuit includes an elastic wave resonator.

7. The radio-frequency module according to claim 1, wherein the variable matching circuit is connected in series between the at least one filter and a corresponding one of the at least three output terminals of the switch circuit.

8. The radio-frequency module according to claim 1, further comprising an elastic wave circuit connected in series with the variable matching circuit.

9. The radio-frequency module according to claim 1, wherein a plurality of the variable matching circuits are connected between the at least three filters and the switch circuit.

10. The radio-frequency module according to claim 9, wherein each of the plurality of variable matching circuits includes an inductance element and a variable capacitor element.

* * * * *